United States Patent
Buff (10) Patent No.: US 10,217,601 B2
(45) Date of Patent: *Feb. 26, 2019

(54) ION SOURCE (71) Applicant: Varian Semiconductor Equipment Associates, Inc., Gloucester, MA (US)

(72) Inventor: James Buff, Brookline, NH (US)

(73) Assignee: VARIAN SEMICONDUCTOR EQUIPMENT ASSOCIATES, INC., Gloucester, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/933,065

(22) Filed: Mar. 22, 2018

(65) Prior Publication Data
US 2018/0218876 A1  Aug. 2, 2018

Related U.S. Application Data

(63) Continuation of application No. 13/798,966, filed on Mar. 13, 2013, now Pat. No. 9,928,988.

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01)

(58) Field of Classification Search
CPC .............................. H01J 37/3171; H01J 37/08
See application file for complete search history.

(56) References Cited

U.S. PATENT DOCUMENTS

| | | | |
|---|---|---|---|
| 5,206,516 | A | 4/1993 | Keller et al. |
| 7,700,925 | B2 | 4/2010 | Radovanov et al. |
| 2003/0210051 | A1 | 11/2003 | Aihara et al. |
| 2005/0285597 | A1 | 12/2005 | Maki et al. |
| 2007/0170867 | A1 | 7/2007 | Persing et al. |
| 2009/0085557 | A1 | 4/2009 | Krozer et al. |
| 2009/0166554 | A1 | 7/2009 | Radovanov et al. |
| 2010/0116983 | A1 | 5/2010 | Benveniste et al. |
| 2010/0171048 | A1 | 7/2010 | Nakamoto et al. |
| 2011/0026801 | A1 | 2/2011 | Dohata et al. |
| 2011/0140641 | A1 | 6/2011 | Won et al. |

FOREIGN PATENT DOCUMENTS

| | | |
|---|---|---|
| EP | 1180783 A2 | 2/2002 |
| JP | 2980964 B2 | 5/1992 |
| KR | 100687419 B1 | 2/2007 |
| WO | 0225685 A1 | 3/2002 |

*Primary Examiner* — Nicole Ippolito
*Assistant Examiner* — Sean Luck (57) ABSTRACT

An ion source includes an ion source chamber having a longitudinal axis, the ion source chamber operative to define a plasma therein. The ion source also includes a split solenoid assembly comprising a first solenoid and a second solenoid that are mutually disposed along opposite sides of the ion source chamber, where each of the first solenoid and second solenoid comprises a metal member having a long axis parallel to the longitudinal axis of the ion source chamber, and a main coil having a coil axis parallel to the long axis and comprising a plurality of windings that circumscribe the metal member. The main coil defines a coil footprint that is larger than an ion source chamber footprint of the ion source chamber.

20 Claims, 7 Drawing Sheets

ION SOURCE

This application is a continuation of, and claims the benefit of priority to, U.S. patent application Ser. No. 13/798,966, filed Mar. 13, 2013, entitled "Ion Source", which application is incorporated herein by reference in its entirety.

FIELD

This disclosure relates to ion implantation and semiconductor fabrication. More particularly, the present disclosure and in particular to improved ion sources.

BACKGROUND

In high volume manufacturing processes such as semiconductor device fabrication and solar cell manufacturing, there is a continuing need to improve substrate throughput. This places a demand to improve throughput for processes including ion implantation. In one example, as the size of silicon wafers continues to scale upwardly, ion sources having a much larger current output are needed to meet required wafer throughput.

Beamline ion implantation apparatus may employ indirectly heated cathode (IHC) ion sources or other sources in which an elongated aperture is used to extract an ion beam. One manner of achieving higher ion current for implantation is to employ an ion source having a longer extraction aperture for a given ion density so that a greater total current may be extracted from the ion source. Dipole magnets are used to generate magnetic fields to enhance plasma density in conventional ion sources such as IHC sources that have more compact extraction optics where the extraction aperture is typically less than about 100 mm in length. However, such dipole magnets do not generate desired beam uniformity in elongated ion sources where the extraction aperture is longer. In view of the above, it will be appreciated that there is a need to improve ion implantation apparatus, and in particular to develop ion source technology to increase the current generating capability in the ion source while maintaining acceptable ion beam properties.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an ion source may include an ion source chamber having a longitudinal axis, the ion source chamber operative to define a plasma therein. The ion source may also include a split solenoid assembly comprising a first solenoid and a second solenoid that are mutually disposed along opposite sides of the ion source chamber, where each of the first solenoid and second solenoid comprises a metal member having a long axis parallel to the longitudinal axis of the ion source chamber, and a main coil having a coil axis parallel to the long axis and comprising a plurality of windings that circumscribe the metal member. The main coil defines a coil footprint that is larger than an ion source chamber footprint of the ion source chamber.

In a further embodiment, an ion implantation system for implanting a substrate includes an ion source chamber having a longitudinal axis, the ion source chamber operative to define a plasma therein. The ion implantation system also includes a split solenoid assembly comprising a first solenoid and a second solenoid that are mutually disposed along opposite sides of the ion source chamber. Each of the first solenoid and second solenoid may include a metal member having a long axis parallel to the longitudinal axis of the ion source chamber, a main coil having a coil axis parallel to the long axis and comprising a plurality of windings that circumscribe the metal member, the main coil defining a footprint that covers the ion source chamber; and beam components to direct a beam of ions extracted from the ion source chamber to the substrate.

DETAILED DESCRIPTION

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 1:
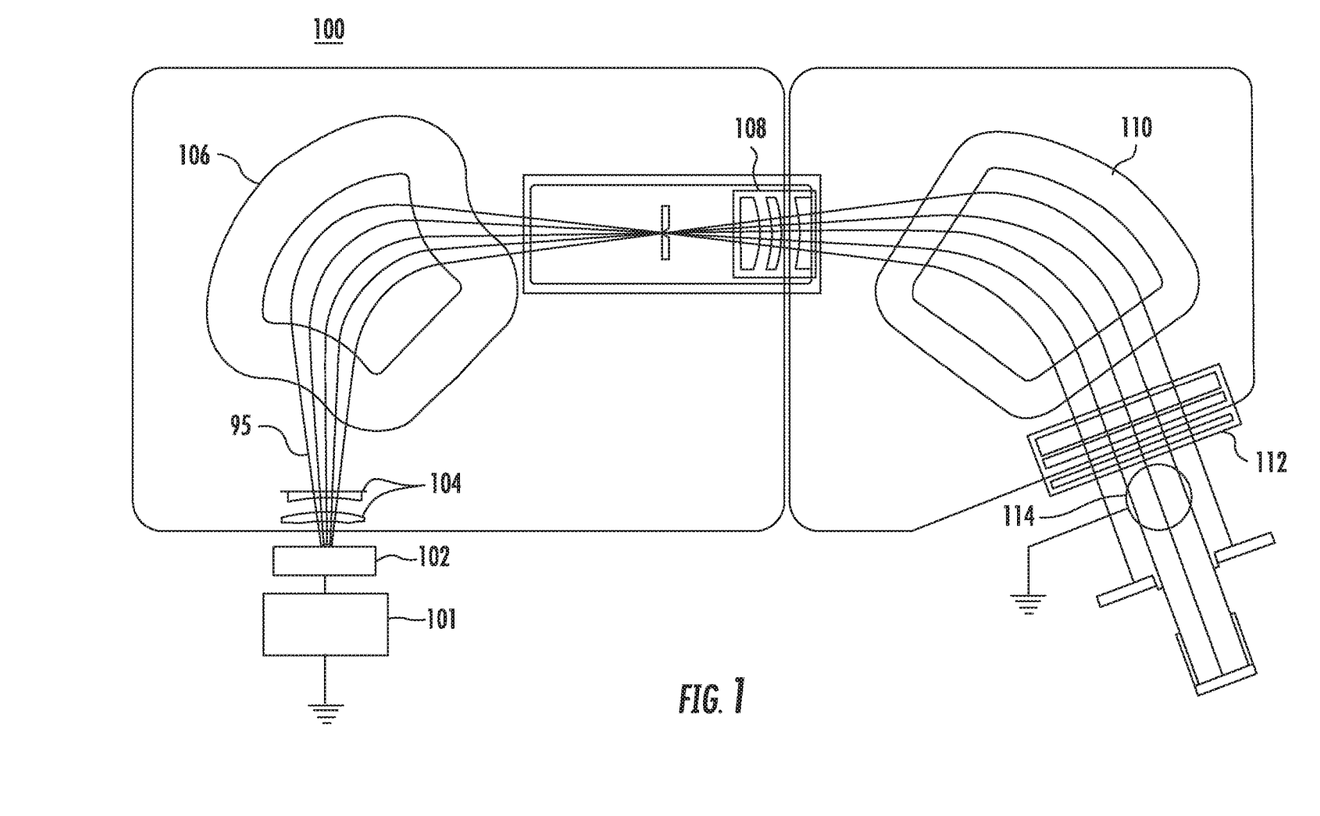
FIG. 1 depicts an ion implantation system consistent with various embodiments of the disclosure.

Various embodiments involve apparatus and systems to produce high current ion sources. Referring to the drawings, FIG. 1 is a block diagram of an ion implantation system 100 including an ion source 102. A power supply 101 supplies the required energy to source 102 which is configured to generate ions of a particular species. The generated ions are extracted from the source through a series of electrodes 104 (extraction electrodes) and formed into a beam 95 which is directed and manipulated by various beam components 95,106,108,110,112 to a substrate. In particular, after extraction, the beam 95 passes through a mass analyzer magnet 106. The mass analyzer is configured with a particular magnetic field such that only the ions with a desired mass-to-charge ratio are able to travel through the analyzer. Ions of the desired species pass through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some cases, a second deceleration stage 112 may be disposed between corrector magnet 110 and support 114. The ions lose energy when they collide with electrons and nuclei in the substrate and come to rest at a desired depth within the substrate based on the acceleration energy.

The present embodiments may be implemented in ion implantation systems, such as ion implantation system 100. In particular, the present embodiments may be implemented using a novel "split solenoid" ion source as described herein below. FIGS. 2 to 4C depict embodiments of split solenoid ion sources which may be used as the ion source 102 of the ion implantation system 100 in various embodiments. In other embodiments, the split solenoid ion sources as stand-alone devices or may be deployed in any other apparatus that employs ion sources.

The terms "split solenoid" and "split solenoid assembly" refer to a configuration or magnetic assembly that includes two or more separate main coils having axes that are generally aligned parallel to one another, where each coil is wound round a metal piece or member. The two or more main coils impart solenoid like properties to a region or space between the two or more main coils, which space contains an ion source chamber. However, rather than circumferentially enclosing the ion source chamber as in an ideal cylindrical solenoid, the two or more "split solenoids" of a split solenoid assembly only bound the ion source along separate portions that are separated by open spaces. This facilitates convenient extraction of an ion beam from the ion source chamber that is bounded by the split solenoid assembly.

Figure 7:
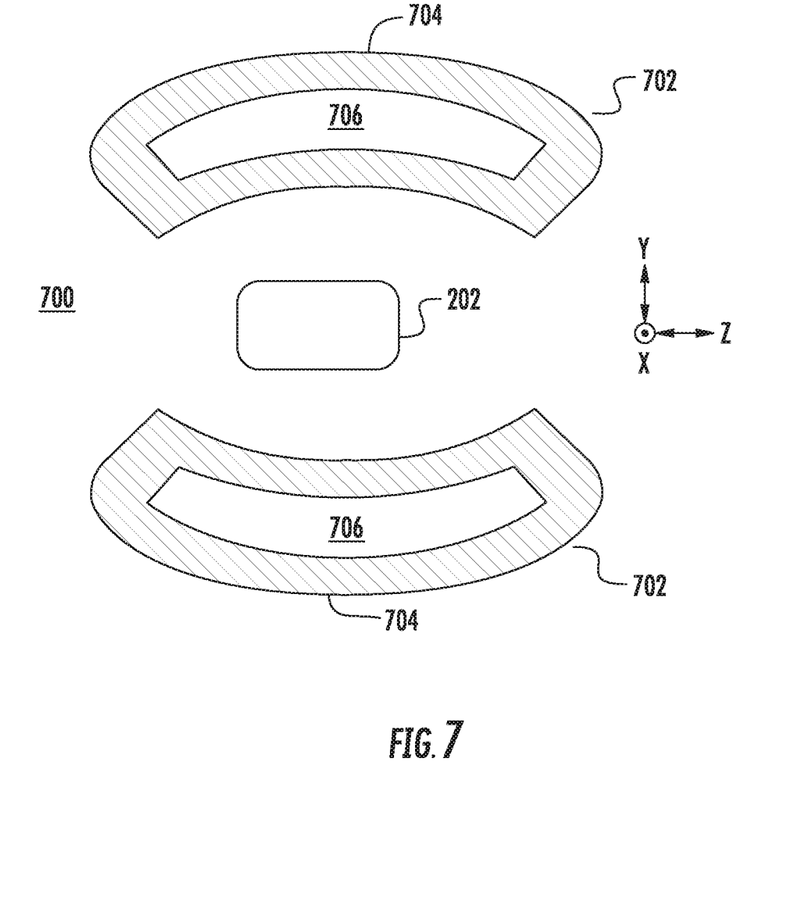
FIG. 7 depicts an end view of another embodiment of an ion source.

In a given solenoid of a split solenoid assembly, each main coil surrounds a metal member that is relatively long in two dimensions and relatively short in a third dimension. Notably, a main coil, together with its metal member may be referred to herein as a "solenoid." The solenoids may generally have a planar shape but may also be curved at least along one direction as shown in FIG. 7. As detailed below, this magnetic assembly is used to generate uniform magnetic fields in a space between the main coils. This allows the length of such split solenoid ion sources to be scaled up to a large size not achieved by conventional by conventional dipole magnetic structures that are used to generate magnetic fields in conventional ion sources.

Figure 2A:
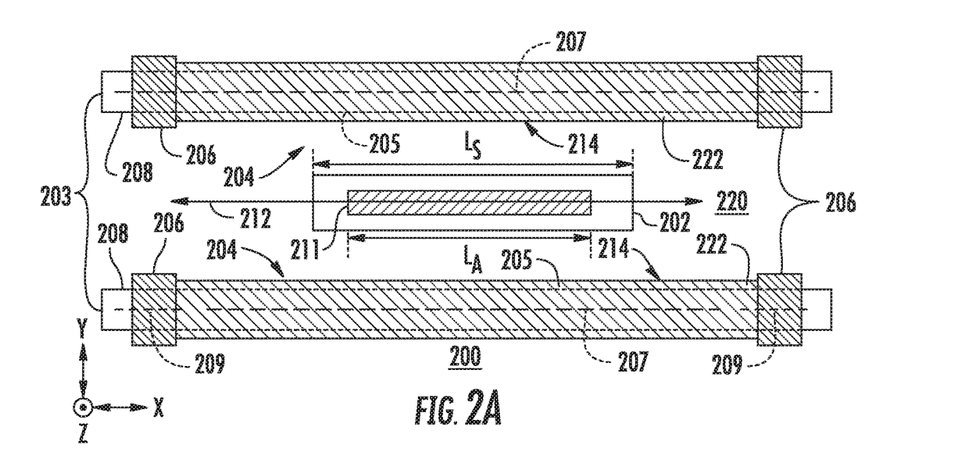
FIG. 2A depicts a side view of an ion source consistent with the present embodiments.
Figure 2B:
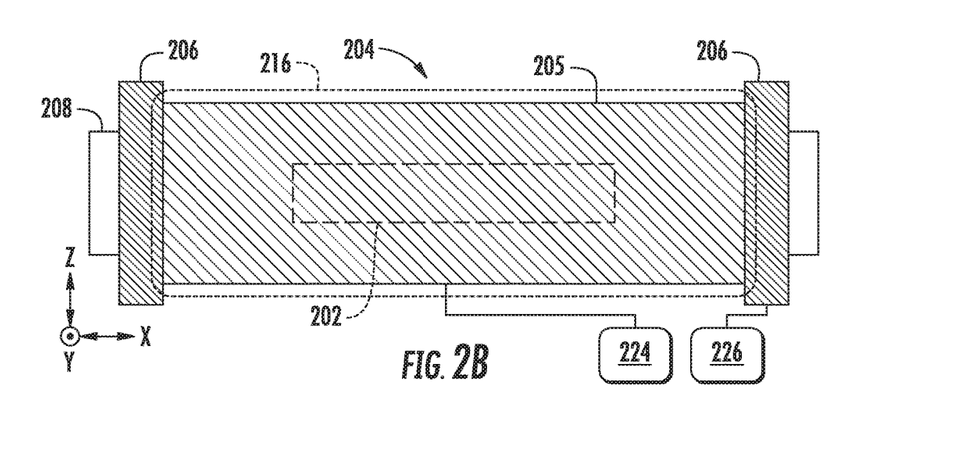
FIG. 2B depicts a top view of the ion source of FIG. 3A.
Figure 2C:
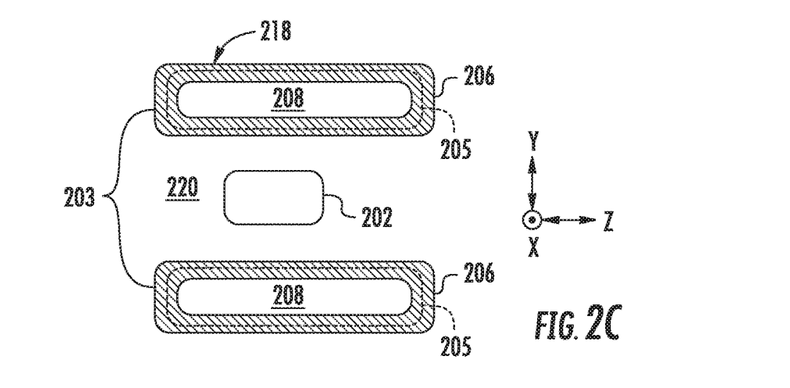
FIG. 2C depicts an end view of the ion source of FIG. 3A.

Turning to FIG. 2A there is shown a side view of a split solenoid ion source 200. FIG. 2B shows a top view of the split solenoid ion source 200, while FIG. 2C shows an end view of the split solenoid ion source 200. As shown in the figures, the split solenoid ion source 200 includes an ion source chamber 202, which is bounded by a split solenoid assembly 203 that includes a solenoid 204 located on one side of the ion source chamber 202 and another solenoid 204 located on an opposite side. The ion source chamber 202 may be generally constructed according to known technology. The ion source chamber 202 and solenoids may be affixed to other structures (not shown). In various embodiments the ion source chamber 202 may be constructed as Bernas type ion source, indirectly heated cathode (IHC) ion source, or other type of in source. The embodiments are not limited in this context. The ion source chamber 202 is characterized by a longitudinal axis 212 (also termed "long axis"), which is parallel to the X-direction in the Cartesian coordinate system used in the figures. The ion source chamber is generally elongated along this longitudinal axis 212, and may extend up to one half meter or more in some embodiments.

As illustrated, the solenoids 204 each have flat faces 214 that face one another and extend so as to create a footprint 216 that encompasses the ion source chamber 202, as illustrated in FIG. 2B. In particular, the footprint 216 represents a projected area of the main coils 205 in the X-Z plane. As detailed below, the solenoids 204 are configured to generate uniform magnetic fields in the ion source chamber 202, which facilitates the production of more uniform ion beams, in addition to affording scalability of such ion sources to larger dimension. In this manner higher current ion beams having acceptable beam uniformity are achievable using the split solenoid ion source 200.

In the present embodiments, a solenoid may include a main coil and a set of optional trim coils. This is illustrated in particular in FIGS. 2A to 2C, which depict a main coil 205 that is wound around a flat metal plate 208. The flat metal plate 208 is elongated in a direction parallel to the longitudinal axis 212 of the ion source chamber 202. The coil axis 207 of the main coil 205 is generally parallel to the longitudinal axis 212 of the ion source. The flat metal plate acts to block magnetic fields generated by outer portions of each coil from extending into the region containing the ion source chamber 202. In various embodiments the flat metal plate 208 may be a steel or similar metal. As illustrated, the flat metal plate extends beyond outer ends of the coils of each solenoid 204 so as to screen out magnetic fields generated by outer portion 218 of each solenoid from penetrating into the region 220 between the respective solenoids 204. Accordingly, when current is sent from the current source 224 to the main coils 205, a magnetic field that is generated by opposing main coils 205 and penetrates the ion source chamber 202 is generated from inner portions 222 of each main coil 205, as shown in FIG. 2A.

In various embodiments, in addition to the main coil 205, a pair of trim coils 206 are included at opposite ends of each solenoid 204. As shown in FIG. 2A, the trim coil axis 209 of a trim coil 206 is aligned with the coil axis 207 of a main coil 205. Each trim coil 206 is coupled to a current source 226 that is separate from the current source 224. In this manner, the trim coils 206 are configured to receive, if desired, a different amount of current as compared to that sent to the main coils 205. Although the current direction of current sent to the main coils 205 and trim coils 206 may generally be the same, the current in trim coils 206 may be generated in a direction opposite to that of the current in main coils 205. As detailed below, the trim coils 206 may be used to adjust magnetic fields produced in the vicinity of the ion source chamber 202.

Notably, the split solenoid ion source 200 provides advantages over conventional ion sources that employ dipole source magnets. The split solenoid ion source 200 in particular embodies useful properties of an ideal solenoid. In an infinitely long ideal solenoid the magnetic field inside is homogeneous and magnetic field strength does not depend on distance from the solenoid axis. Thus, an ideal cylindrical solenoid magnet that encompasses an ion source chamber may produce uniform magnetic fields therein. However, extraction of ions from an ion source chamber within an ideal solenoid is not practical because of the complete envelopment by the solenoid of the ion source chamber except along its ends.

By providing a split solenoid assembly that contains two solenoids the split solenoid ion source 200 combines the benefits of a relatively uniform magnetic field as in an ideal solenoid with an easily accessibly ion source chamber 202 from which a uniform ion beam may be readily extracted, as discussed further below. In particular variants of the split solenoid ion source 200 may provide an almost uniform magnetic field within the ion source chamber 202, including a nearly parallel arrangement of magnetic field lines in the region of the ion source chamber 202 from which an ion beam is extracted. This enables the ability to scale the ion source chamber 202 size by simply extending the length of the split solenoid assembly that flanks such an ion source chamber.

Consistent with the present embodiments, a length of the split solenoid assembly along the longitudinal axis 212 may range from 250 mm to 2000 mm, and the length $L_S$ of the ion source chamber is about 100 mm to 500 mm, while the aperture length $L_A$ of an aperture 211 of the ion source chamber 202 is less than or equal to $L_S$. Moreover, for a given split solenoid ion source, such as split solenoid ion source 202, the length of the split solenoid assembly 203 along the longitudinal axis 212 is generally greater than $L_S$.

Figure 3:
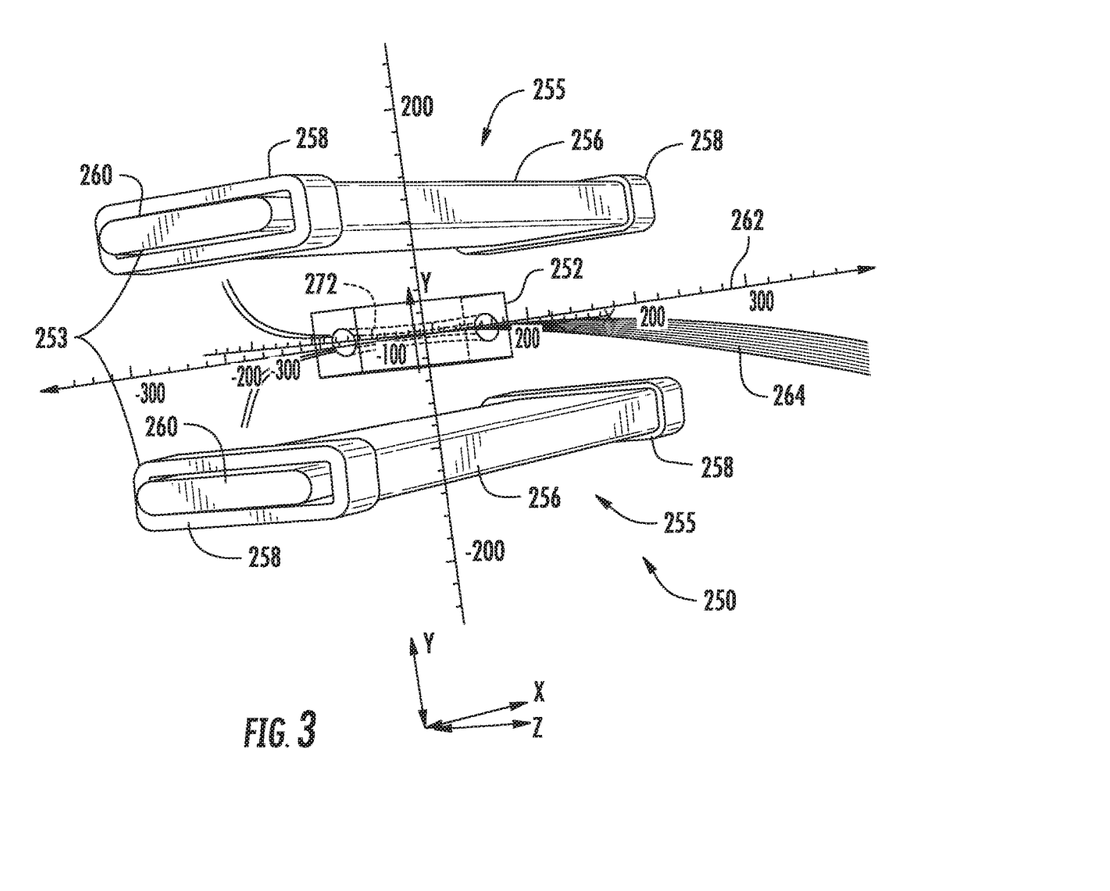
FIG. 3 depicts a perspective view of another ion source consistent with additional embodiments.

Consistent with further embodiments, FIG. 3 depicts a perspective view of another split solenoid ion source 250 in operation. The split solenoid ion source 250 contains an ion source chamber 252 and a split solenoid assembly 253 that includes a pair of solenoids 255 that extend on two opposite sides of the ion source chamber 252. In this embodiment, the solenoids 255 each include a main coil 256 and a pair of trim coils 258 that are arranged similarly to the arrangement of a split solenoid shown in FIGS. 2A-2C. In particular the main coils 256 and trim coils 258 are each wound around an elongated flat metal member 260 whose long direction extends parallel to the longitudinal axis 262 of the ion source chamber 252. When current is drawn through the solenoids 255 a uniform magnetic field 272 is generated through the center of the ion source chamber 252. As further illustrated in FIG. 3, when a plasma (not shown) is generated in the ion source chamber 252 an ion beam containing the ions 264 may be extracted from the ion source chamber. Due to the uniform magnetic field 272, the ion beam may be uniform over its width when extracted.

Figure 4A:
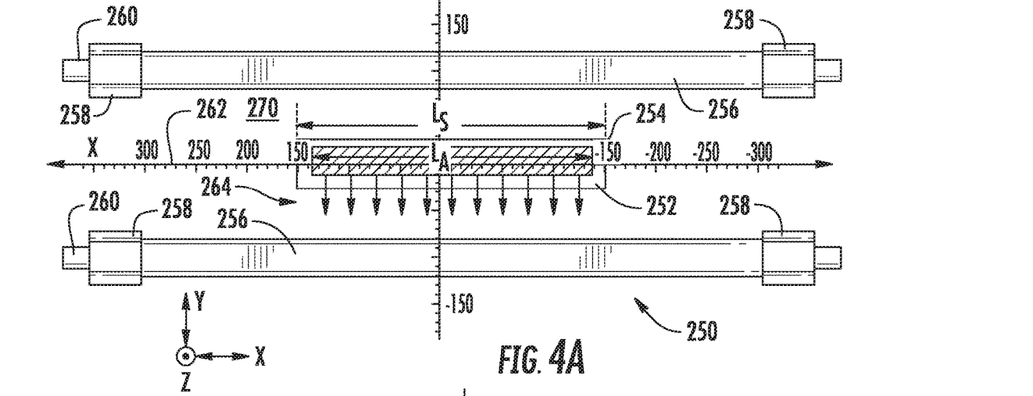
FIG. 4A depicts a side view during operation of the ion source of FIG. 3 consistent with the various embodiments.
Figure 4B:
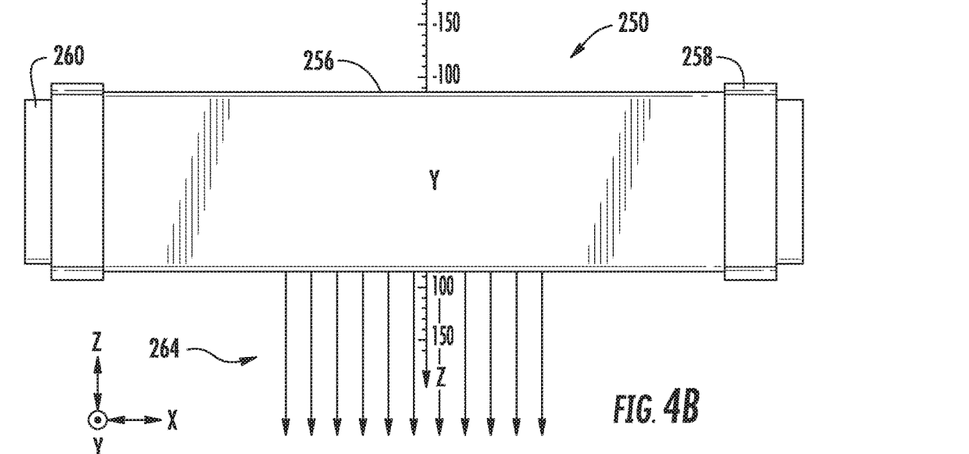
FIG. 4B depicts a top view of the scenario of operation of the ion source shown in FIG. 4A.
Figure 4C:
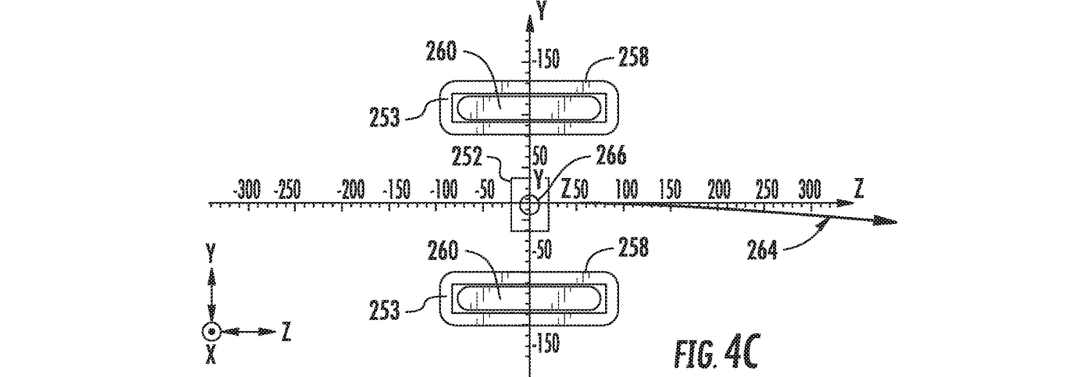
FIG. 4C depicts an end view of the scenario of operation of the ion source shown in FIG. 4A.

FIGS. 4A, 4B, and 4C depict a side view, top view, and end view respectively of the split solenoid ion source 250 that highlight further advantages of the present embodiments. In FIG. 4A, an aperture 254 in the ion source chamber 252 is also depicted. Referring also to FIG. 4C, ions generated in a plasma 266 are extracted through the aperture 254 and may be accelerated by an extraction system (not shown) to direct the ions 264 as a beam of ions having a desired energy. The aperture 254 is characterized by an aperture length $L_A$ along the longitudinal axis 262 of the ion source chamber 252. The length of the aperture may be used to define the initial size or width of the ion beam formed by ions 264 as the ions 264 are extracted from the ion source chamber 252.

By scaling upwardly the length $L_S$ of the ion source chamber 252, the aperture length $L_A$ can be concomitantly scaled upwardly to increase the size of a beam of ions 264. For a given plasma density, this may lead to a proportional upward scaling of ion current with increased $L_S$. Because such an ion source chamber in principle only needs an increase in length along the X-direction, scaling of ion sources constructed according to the present embodiments for larger current production is straightforward. In the example particularly illustrated in FIG. 4A, the length $L_S$ of the ion source chamber 252 is 325 mm. An experimental embodiment has produced an operational ion source chamber of similar dimensions having an aperture length $L_A$ of 250 mm for an IHC ion source, thereby increasing the current capability over conventional IHC ion sources that are typically less than 100 mm in length. For example, a conventional apparatus based upon an IHC source having a 55 mm extraction aperture yields about 50 mA current, while an apparatus designed according to the present embodiments having a 225 mm aperture yields 120 mA or more of high quality beam current.

Figure 5A:
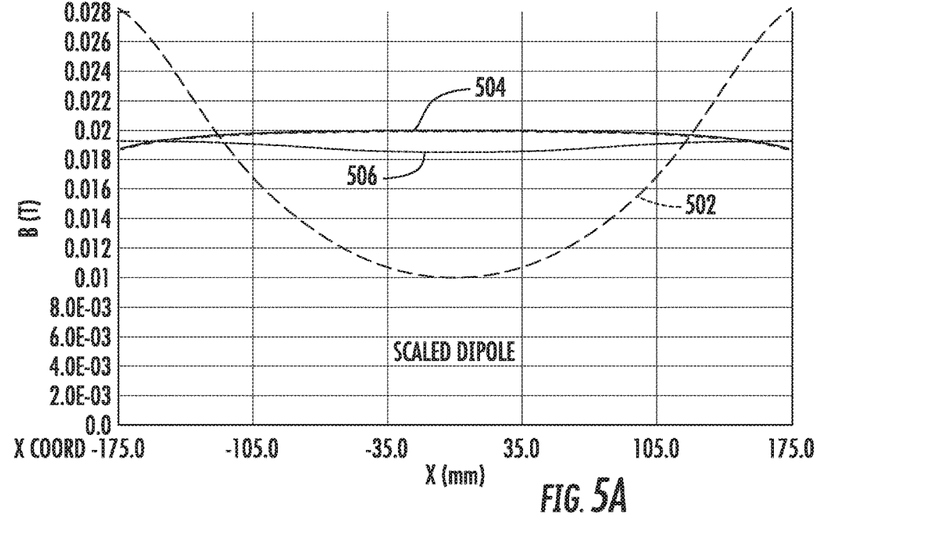
FIG. 5A illustrates variation of magnetic field intensity in an ion source configured according to embodiments of the disclosure.

In addition, the present embodiments provide for increased uniformity of magnetic fields within an ion source even when sources are scaled to large dimensions, such as dimensions greater than 100 mm in length. FIG. 5A compares magnetic uniformity of a split solenoid ion source constructed according to the present embodiments with that of a conventional dipole magnet ion source. The curve 502 represents the magnetic field strength (in Tesla) as a function of position for a dipole magnet source showing the calculated variation in magnetic field in a middle region of an ion source along the X-direction over a 350 mm range, which approximates the length of the aforementioned 325 mm IHC source. In this case the magnetic field strength is greatest at the extremities of the ion source (−175 mm and +175 mm) and decreases by about two thirds at the center region.

In contrast to this extreme non-uniformity in magnetic field strength, the curves 504 and 506 present calculated magnetic field strength for a split solenoid ion source over the same range as for the dipole magnet case, showing that magnetic strength varies by less than 10% over the entire 350 mm range. Magnetic fields of about 200 Gauss (0.02 Tesla) are achievable in embodiments of a split solenoid ion source. In particular, the curve 504 represents magnetic field strength when no current is supplied to the trim coils while curve 506 represents magnetic field strength when a fixed amount of current is supplied to the trim coils. When no current is supplied to the trim coils, the magnetic field strength (curve 504) exhibits a "frown" shape in which magnetic field strength peaks in the center, while when a specific amount of current is supplied to the trim coils the magnetic field strength (curve 506) exhibits a "smile" shape in which the magnetic field strength reaches a minimum in the center. It is to be noted that the level of current supplied to trim coils may be used to further adjust the shape of magnetic field strength as a function of position so that the frown of smile can be minimized.

Figure 5B:
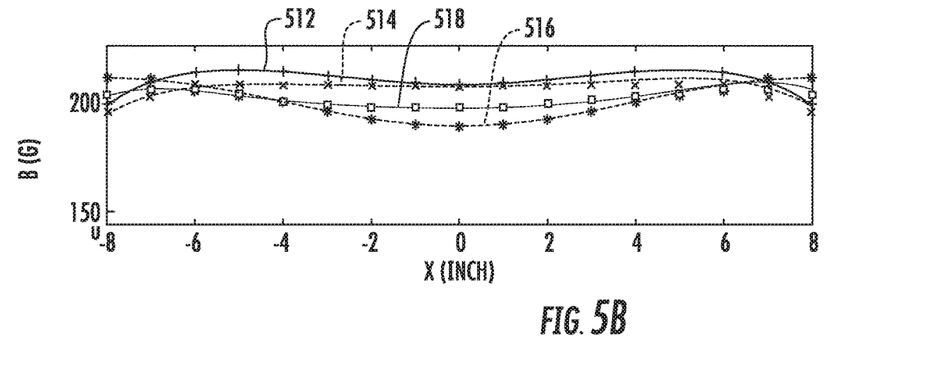
FIG. 5B illustrates a comparison of experimental and simulated variation of magnetic field intensity in an ion source configured according to embodiments of the disclosure.

FIG. 5B provides further details showing a comparison of simulated and experimental data for magnetic field strength uniformity produced in a split solenoid ion source. The curve 512 illustrates simulated magnetic field strength along the X-direction with no trim coil current, while the curve 514 illustrates measured magnetic field strength with no trim coil current. The curve 516 illustrates simulated magnetic field strength with trim coil current, while the curve 518 illustrates measured magnetic field strength with trim coil current. In the case of curve 518, when trim coil current is applied, the maximum variation in magnetic field strength is only about 5%.

Figure 6A:
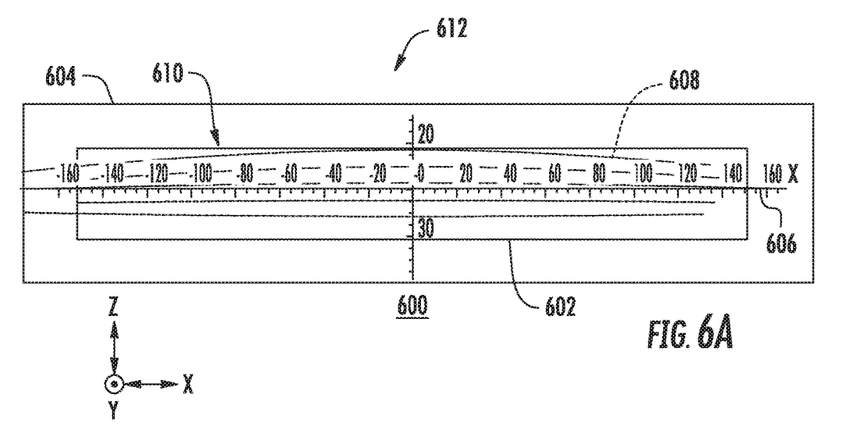
FIG. 6A depicts magnetic field in an ion source in one exemplary configuration of ion source chamber and split solenoid assembly.
Figure 6B:
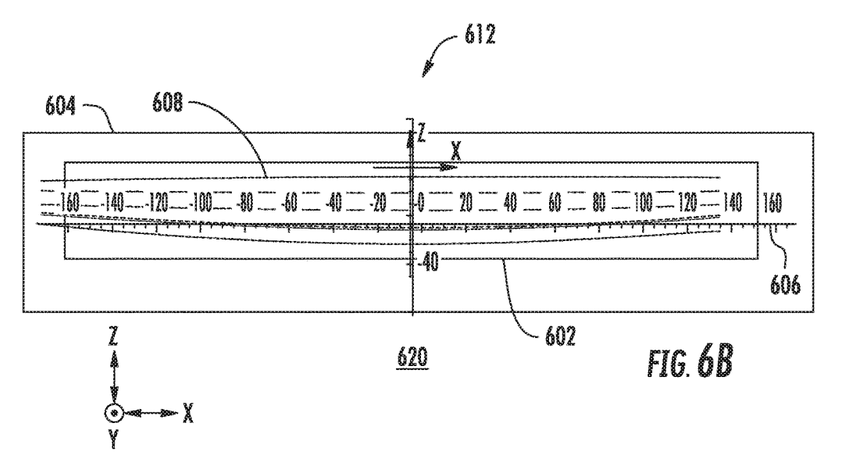
FIG. 6B depicts magnetic field in an ion source in another exemplary configuration of ion source chamber and split solenoid assembly.

In addition to reducing variation in magnetic field strength along the long direction (parallel to the X-axis) of an ion source, the split solenoid ion source design of the present embodiments facilitates the ability to adjust the magnetic field direction in different portions of an ion source for optimal beam geometry. FIGS. 6A and 6B present the results of simulation of magnetic field shape in an ion source chamber 602 for a split solenoid ion source consistent with the present embodiments. The figures present a top view in the X-Z plane where the ion beam (not shown) exits toward the top of the page. In FIG. 6A, a split solenoid ion source 600 includes the ion source chamber 602 whose center along the Z-direction is aligned with the longitudinal axis 606 of the split solenoid 604. When the ion source chamber 602 has its center aligned with the center of the split solenoid 604, the magnetic field lines 608 (shown in dashed form) near the faceplate (faceplate and extraction apparatus are not shown) edge 610 are substantially curved, showing an outward bulge toward the center of the faceplate edge 610. Because the faceplate edge 610 is disposed toward the extraction side 612 where ions exit the split solenoid ion source 600, magnetic field line curvature may affect the trajectories of exiting ions.

In FIG. 6B, a split solenoid ion source 620 includes the same ion source chamber 602 whose center is now shifted forward by 15 mm along the Z-direction with respect to the longitudinal axis 606 of the split solenoid 604. In this case, the magnetic field lines 608 near the faceplate edge 610 are substantially straight. This latter embodiment may be useful where it is desired to generate parallel ion trajectories across a width of an ion beam extracted from the split solenoid ion source.

In addition to the generally planar split solenoid ion sources disclosed hereinabove, the present embodiments include solenoid ion sources in which a pair of solenoids have a curved cross-section as illustrated in FIG. 7. The split solenoid ion source 700 of FIG. 7 may have the general shape of the split solenoid ion source 200 except that the opposing pair of solenoids 702 are curved as viewed along the end view shown. In this case, each coil 704 surrounds a curved (though not planar) plate 706. The solenoids 702 are generally curved inwardly so as to lie on portions of a curve that surround the ion source chamber 202.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion source, comprising:
    an ion source chamber having an elongate shape defined by a height, a width, and a length greater than the height and the width, and a longitudinal axis extending along the length of the elongate shape, the ion source chamber operative to define a plasma therein; and
    a split solenoid assembly comprising a first solenoid and a second solenoid that are mutually disposed along opposite sides of the ion source chamber, each of the first solenoid and second solenoid comprising:
        a metal member having a long axis parallel to the longitudinal axis of the ion source chamber; and
        a main coil having an elongate shape defined by a main coil height, a main coil width, and a main coil length greater than the main coil height and main coil width, the main coil having a coil axis extending along the main coil length parallel to the long axis and the longitudinal axis, the main coil comprising a plurality of windings that circumscribe the metal member, the main coil defining a coil footprint that is larger than an ion source chamber footprint the ion source chamber, wherein the main coil length is at least two times greater than the ion source chamber length and the main coil width is at least two times greater than the ion source chamber width.

2. The ion source of claim 1, further comprising a first current source coupled to the first solenoid and second solenoid wherein the first and second solenoid are interoperative to generate a magnetic field that extends substantially parallel to the longitudinal axis when the first current source transmits a main current to the first and second solenoid.

3. The ion source of claim 1, wherein the first and second solenoid each further comprise a first trim coil and second trim coil disposed at opposite ends of a respective solenoid and defining a trim coil axis concentric with the coil axis of a respective solenoid.

4. The ion source of claim 3, further comprising a second current source separate from the first current source and coupled to the first and second trim coils, wherein first and second trim coils are configured to adjust a magnetic field profile of the ion source that comprises variation in magnetic field intensity in the ion source chamber along the longitudinal axis, wherein when the second current source supplies a first trim coil current, a resulting first magnetic profile comprises a relatively higher magnetic field intensity in a middle region of the ion source chamber as compared to end portions of the ion source chamber, and wherein when the second current source supplies a second trim coil current, a resulting second magnetic profile comprises a relatively lower magnetic field intensity in a middle region of the ion source chamber as compared to end portions of the ion source chamber.

5. The ion source of claim 3, further comprising a second current source separate from the first current source and coupled to the first and second trim coils, the second current source configured to supply a trim coil current that travels in a first configuration, in a same direction as a main coil current of the solenoid generated by the main coils of the split solenoid assembly, and in a second configuration in an opposite direction as the main coil current of the solenoid.

6. The ion source of claim 1, wherein the split solenoid assembly comprising a length along the longitudinal axis of about one 250 mm to 2000 mm.

7. The ion source of claim 1, further comprising an extraction assembly configured to extract an ion beam from the ion source chamber having a beam width of greater than or equal to 100 mm.

8. The ion source of claim 1, wherein the split solenoid assembly operative to generate a magnetic field substantially parallel to the longitudinal axis of the ion source chamber along an extraction edge of the ion source from which an ion beam exits the ion source chamber.

9. The ion source of claim 1, wherein the ion source comprising an ion extraction side from which ions exit the ion source, wherein a center of ion source chamber is displaced toward the ion extraction side with respect to a long axis of the metal member.

10. The ion source of claim 1, wherein the ion source chamber comprising an indirectly heated cathode ion source chamber.

11. An ion implantation system for implanting a substrate, comprising:
   an ion source chamber having an elongate shape defined by a height, a width, and a length greater than the height and the width of the elongate shape, and a longitudinal axis extending along the length of the elongate shape, the ion source chamber operative to define a plasma therein; and
   a split solenoid assembly comprising a first solenoid and a second solenoid that are mutually disposed along opposite sides of the ion source chamber so that the first solenoid and the second solenoid are not in direct physical contact with one another, each of the first solenoid and second solenoid comprising:
      a metal member having a long axis parallel to the longitudinal axis of the ion source chamber; and
      a main coil having an elongate shape defined by a main coil height, a main coil width, and a main coil length greater than the main coil height and main coil width, the main coil having a coil axis extending along the main coil length parallel to the long axis and the longitudinal axis, the main coil comprising a plurality of windings that circumscribe the metal member, the main coil defining a coil footprint that is larger than an ion source chamber footprint the ion source chamber, wherein the main coil length is at least two times greater than the ion source chamber length and the main coil width is at least two times greater than the ion source chamber width.

12. The ion implantation system of claim 11, further comprising a first current source coupled to the first solenoid and second solenoid wherein the first and second solenoid are interoperative to generate a magnetic field that extends substantially parallel to the longitudinal axis when the first current source transmits a main current to the first and second solenoid.

13. The ion implantation system of claim 11, wherein the split solenoid assembly comprises a length along the longitudinal axis of about 0.5 meters to two meters.

14. The ion implantation system of claim 11, wherein the ion source further comprises an extraction assembly configured to extract an ion beam from the ion source chamber having a beam width of greater than about 0.1 meters.

15. The ion implantation system of claim 11, wherein the ion source chamber comprises an indirectly heated cathode ion source chamber.

16. An ion source, comprising:
   an ion source chamber having a shape defined by a height, a width, and a length greater than the height and the width, and a longitudinal axis extending along the length of the elongate shape; and
   a split solenoid assembly comprising a first solenoid and a second solenoid that are mutually disposed along opposite sides of the ion source chamber, each of the first solenoid and second solenoid comprising:
      a metal member having a long axis parallel to the longitudinal axis of the ion source chamber; and
      a main coil having an elongate shape defined by a main coil height, a main coil width, and a main coil length greater than the main coil height and main coil width, the main coil having a coil axis extending along the main coil length parallel to the long axis and the longitudinal axis, the main coil comprising a plurality of windings that circumscribe the metal member, wherein the main coil length is at least two times greater than the ion source chamber length and the main coil width is at least two times greater than the ion source chamber width.

17. The ion source of claim 16, further comprising a first current source coupled to the first solenoid and second solenoid wherein the first and second solenoid are interoperative to generate a magnetic field that extends substantially parallel to the longitudinal axis when the first current source transmits a main current to the first and second solenoid.

18. The ion source of claim 16, wherein the first and second solenoid each further comprise a first trim coil and second trim coil disposed at opposite ends of a respective solenoid and defining a trim coil axis concentric with the coil axis of a respective solenoid.

19. The ion source of claim 18, further comprising a second current source separate from the first current source and coupled to the first and second trim coils, wherein first and second trim coils are configured to adjust a magnetic field profile of the ion source that comprises variation in magnetic field intensity in the ion source chamber along the longitudinal axis, wherein when the second current source supplies a first trim coil current, a resulting first magnetic profile comprises a relatively higher magnetic field intensity in a middle region of the ion source chamber as compared to end portions of the ion source chamber, and wherein when the second current source supplies a second trim coil current, a resulting second magnetic profile comprises a relatively lower magnetic field intensity in a middle region of the ion source chamber as compared to end portions of the ion source chamber.

20. The ion source of claim 18, further comprising a second current source separate from the first current source and coupled to the first and second trim coils, the second current source configured to supply a trim coil current that travels in a first configuration, in a same direction as a main coil current of the solenoid generated by the main coils of the split solenoid assembly, and in a second configuration in an opposite direction as the main coil current of the solenoid.

* * * * *